(12) United States Patent
Iizuka

(10) Patent No.: US 7,166,504 B2
(45) Date of Patent: Jan. 23, 2007

(54) SEMICONDUCTOR DEVICE MANUFACTURING METHOD

(75) Inventor: Koji Iizuka, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/854,162

(22) Filed: May 27, 2004

(65) Prior Publication Data

US 2004/0259304 A1 Dec. 23, 2004

(30) Foreign Application Priority Data

Jun. 4, 2003 (JP) .............................. 2003-159184

(51) Int. Cl.
*H01L 21/8249* (2006.01)
*H01L 21/4763* (2006.01)

(52) U.S. Cl. ...................... 438/234; 438/236; 438/628; 257/E21.575

(58) Field of Classification Search ................ 438/585, 438/233, 300, 234, 528, 682, 197, 142, 236, 438/532, 628, 491; 257/370, E21.585, E21.575, 257/E21.579, E21.586
See application file for complete search history.

(56) References Cited

U.S. PATENT DOCUMENTS

| | | | | |
|---|---|---|---|---|
| 5,471,085 A | * | 11/1995 | Ishigaki et al. ............. 257/370 |
| 5,940,699 A | * | 8/1999 | Sumi et al. .................. 438/233 |
| 6,258,708 B1 | * | 7/2001 | Takahashi .................... 438/620 |
| 6,436,747 B1 | * | 8/2002 | Segawa et al. ............. 438/628 |
| 6,469,339 B1 | * | 10/2002 | Onakado et al. ............ 257/315 |

FOREIGN PATENT DOCUMENTS

| | | |
|---|---|---|
| JP | 2-128465 | 5/1990 |
| JP | 2-228065 | 9/1999 |
| JP | 2000-216254 | 8/2000 |

* cited by examiner

*Primary Examiner*—Walter Lindsay, Jr.
(74) *Attorney, Agent, or Firm*—McDermott Will & Emery LLP

(57) ABSTRACT

A semiconductor device manufacturing method is provided which is capable of suppressing variation of the resistance value of resistive interconnection and preventing variation of transistor performance. A gate electrode and a resistive interconnection are formed on a substrate and impurity ions are implanted into the surface of the substrate to form source/drain regions (diffusion layers: 1A, 1B) on both sides of the gate electrode. Also, impurity ions are implanted to control the resistance value of the resistive interconnection. Next, a sidewall film is formed to cover the resistive interconnection. Then a heat treatment is performed to activate the source/drain regions (diffusion layers: 1A, 1B).

18 Claims, 15 Drawing Sheets

SEMICONDUCTOR DEVICE MANUFACTURING METHOD

BACKGROUND OF THE INVENTION

1. Field of the Invention

The present invention relates to a semiconductor device manufacturing method and for example to a method for manufacturing a semiconductor device having a gate electrode and a resistive interconnection.

2. Description of the Background Art

In a semiconductor substrate having an element isolation film of the background art, a resistive interconnection having a relatively high resistance value (e.g. a resistance value of about several hundred to several thousand ohms) is formed on the element isolation film and a gate electrode is formed on the semiconductor substrate in isolation from the resistive interconnection.

In the semiconductor device thus structured, impurity ions are implanted into the resistive interconnection to control its resistance value, and impurity ions are also implanted into the semiconductor substrate to form diffusion layers in areas on both sides of the gate electrode. Subsequently a heat treatment is applied to activate the diffusion layers.

Related prior arts include the following (for example, refer to the First to Third Patent Documents): Japanese Patent Application Laid-Open Nos. 2-128465 (1990), 2-228065 (1990), and 2000-216254.

However, in the method above, the heat treatment causes out-diffusion of ions from the resistive interconnection. This makes it impossible to precisely control the resistance value of the resistive interconnection.

Also, while First Patent Document discloses a technique in which an oxide film is formed on the resistive interconnection after formation of transistors, the oxide film formation involves an additional heat treatment, which varies the characteristics of the transistors and makes it impossible to provide highly precise transistors.

Also, even when the resistive interconnection is formed after the formation of the gate electrode, the formation of the resistive interconnection involves an additional heat treatment, which may vary the transistor characteristics.

SUMMARY OF THE INVENTION

An object of the present invention is to provide a semiconductor device manufacturing method that is capable of suppressing variation of the resistance value of resistive interconnection and preventing variation of transistor performance.

According to the present invention, a semiconductor device manufacturing method includes the following steps (a) to (d). The step (a) is forming a resistive interconnection and a gate electrode on a substrate. The step (b) is implanting impurity ions into a surface of the substrate to form a diffusion layer. The step (c) is forming an insulating film to cover the resistive interconnection and the gate electrode. The step (d) is heating the substrate after the step (c) to activate the diffusion layer.

The resistive interconnection is covered by the insulating film before the heat treatment for activating the diffusion layer. This prevents impurity ions contained in the resistive interconnection from diffusing outward during the heat treatment. This consequently suppresses variation of the resistance value of the resistive interconnection due to the heat treatment.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
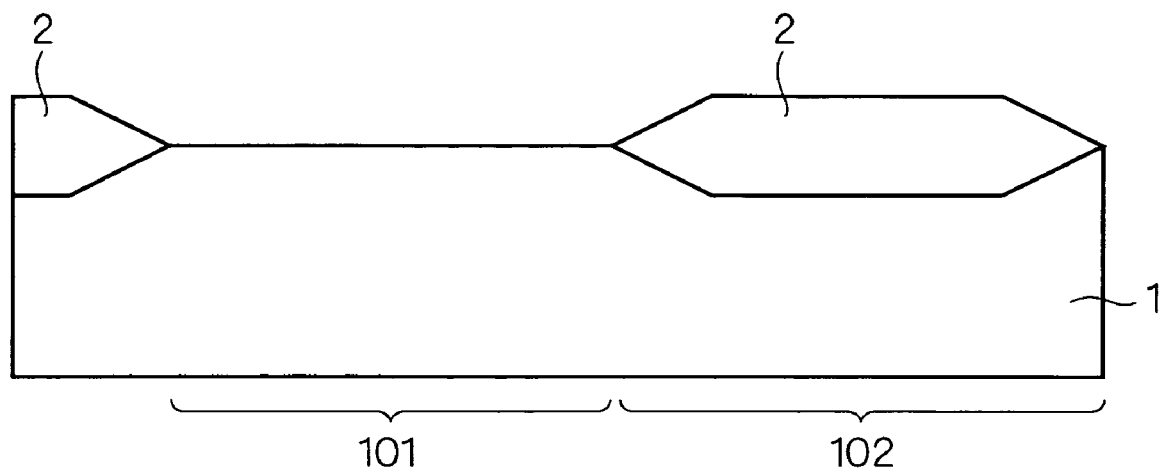
FIGS. 1 to 9 are cross-sectional views illustrating a manufacturing method according to a first preferred embodiment.

The present invention provides a method that is characterized by covering a resistive interconnection with an insulating film before activation of diffusion layers and by forming the insulating film with a minimized extra heat treatment.

The present invention will now be described specifically referring to the drawings showing the preferred embodiments.

<First Preferred Embodiment>

The semiconductor device manufacturing method of a first preferred embodiment is characterized by covering, with a sidewall film, a gate electrode and a resistive interconnection formed on a semiconductor substrate, and then applying a heat treatment for activating diffusion layers, with the sidewall film remaining on side surfaces of the gate electrode and on the top and side surfaces of the resistive interconnection.

The semiconductor device manufacturing method of this preferred embodiment is now described referring to the enlarged cross-sectional views showing the process steps.

First, as shown in FIG. 1, a silicon substrate (hereinafter referred to simply as a substrate) 1 is prepared which has element isolation films 2 formed in the surface. In the substrate 1, the region where transistors are to be formed is referred to as a transistor portion 101 and the region where a resistive interconnection is to be formed is referred to as a resistance portion 102.

Figure 2:
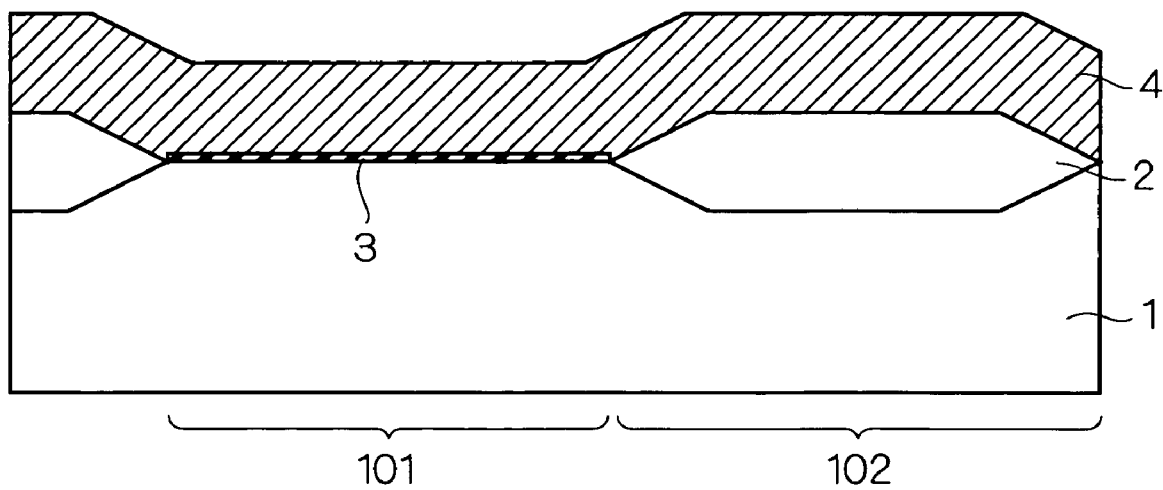

Next, as shown in FIG. 2, a gate oxide film 3 is formed in the transistor portion 101 on the substrate 1, e.g. by thermal oxidation. Then polysilicon 4 is deposited, e.g. by CVD (Chemical Vapor Deposition), on the substrate 1 (on the gate oxide film 3 in the transistor portion 101 and on the element isolation film 2 in the resistance portion 102) to a film thickness of about 150 nm to 300 nm.

Figure 3:
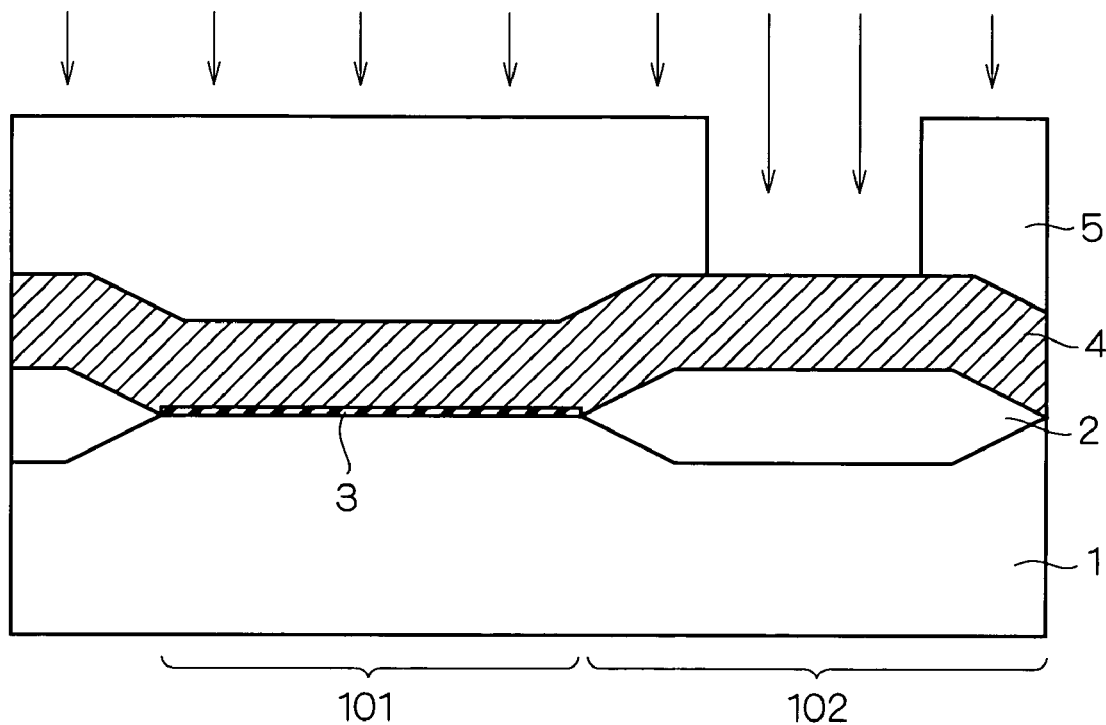

Next, as shown in FIG. 3, a resist 5 is formed on the polysilicon 4 by lithography and patterned so that the polysilicon 4 is exposed in the resistance portion 102.

Then, with the resist 5 thus patterned, impurity ions are implanted into the exposed portion of the polysilicon 4 in the resistance portion 102 to set the resistance of the polysilicon at a given relatively high value (for example, a resistance value of about several hundred to several thousand ohms).

For example, this impurity ion implantation is achieved by implanting impurity ions, such as As (arsenic) or $BF_2$ (boron fluoride), to about $1\times10^{14}$ to $1\times10^{16}$ ions/cm$^2$ at an energy of about 20 to 50 keV.

Figure 4:
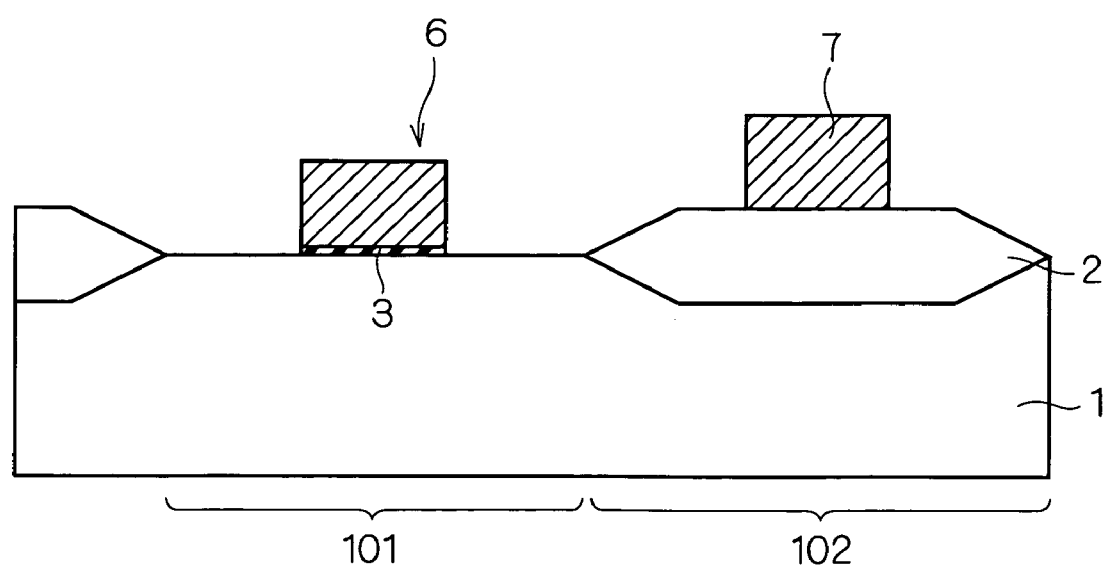

Next, after removal of the resist 5, the polysilicon 4 is patterned into a given shape by lithography so as to form a gate electrode 6 in the transistor portion 101 and a resistive interconnection 7 in the resistance portion 102. FIG. 4 shows this process step.

Figure 5:
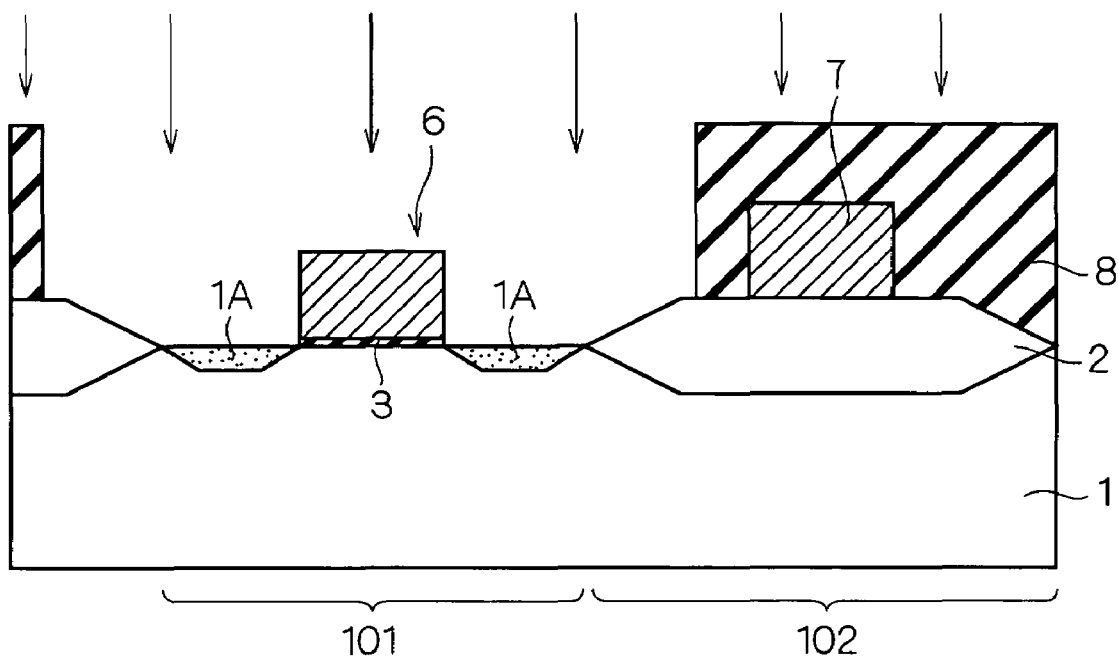

Next, as shown in FIG. 5, a resist 8 is formed by lithography to cover the resistive interconnection 7 in the resistance portion 102, with the transistor portion 101 being exposed. Then, in this condition, impurity ions of a given conductivity type are implanted into the exposed transistor portion 101 to form shallow source/drain regions (they can be regarded as shallow diffusion layers) 1A with a relatively low impurity concentration. This impurity ion implantation is achieved, for example, by implanting impurity ions to about $1\times10^{12}$ to $1\times10^{15}$ ions/cm$^2$ at an energy of about 20 to 50 keV.

In this process step, the impurity ions are not implanted into the resistive interconnection 7 because the resistive interconnection 7 is covered by the resist 8, so that the impurity concentration remains unchanged at the value set by the impurity ion implantation that was performed to raise the resistance; the resistance value of the resistive interconnection 7 is thus not varied by the impurity ion implantation step shown in FIG. 5.

Figure 6:
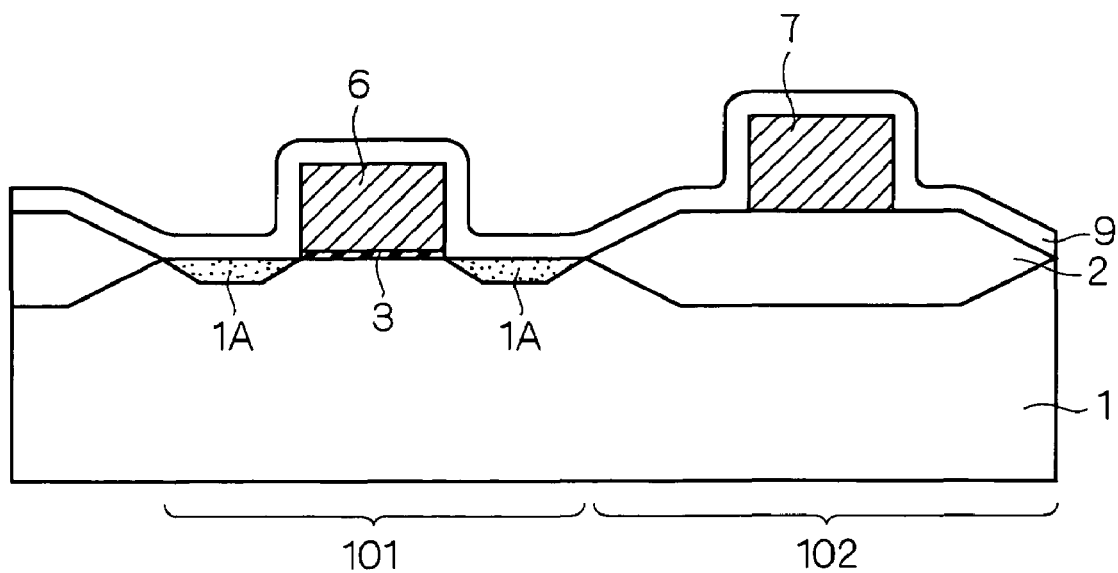

Next, as shown in FIG. 6, after removal of the resist 8, a sidewall film (it can be regarded as an insulating film) 9 is formed, e.g. by CVD, to a thickness of about 40 to 200 nm, so as to cover the semiconductor device processed as shown in FIG. 5.

Figure 7:
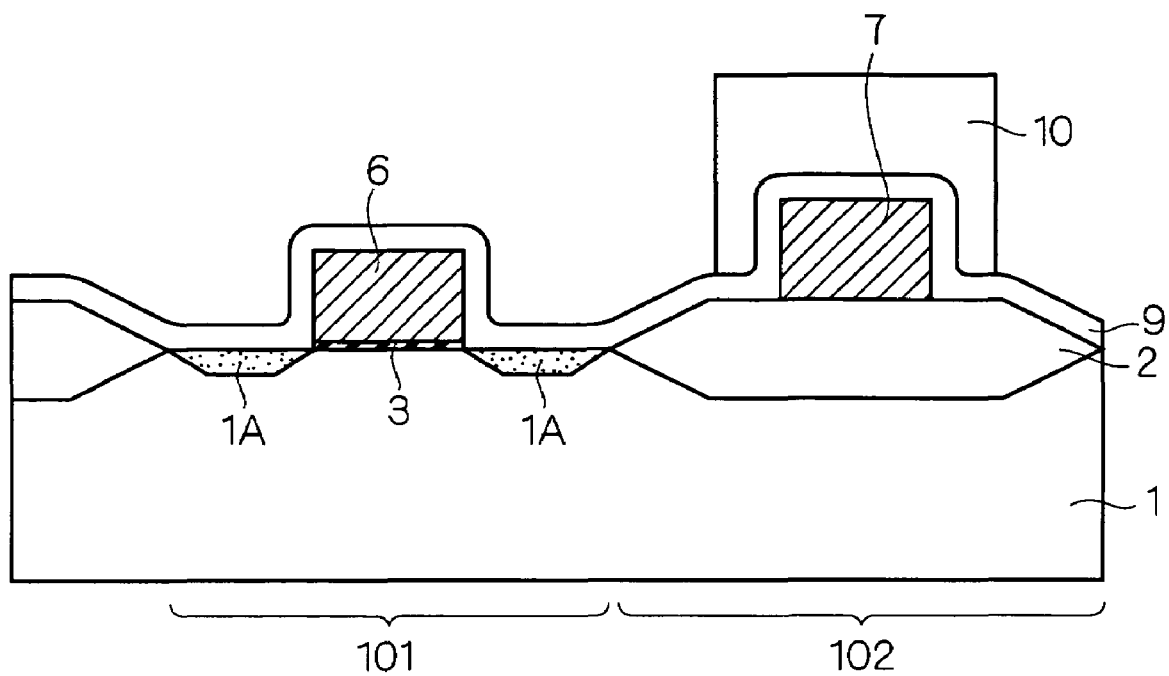

Next, as shown in FIG. 7, with a resist 10 formed by lithography on the resistive interconnection 7 in the resistance portion 102, a normal anisotropic etching process is performed and the resist 10 is removed after the etching.

Figure 8:
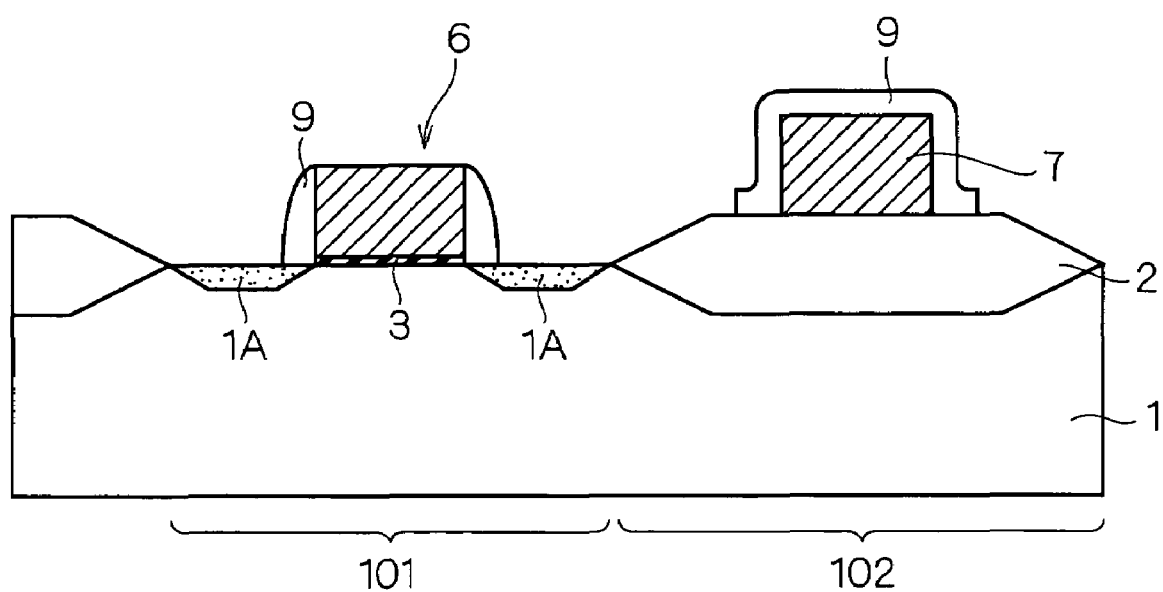

Thus, as shown in FIG. 8, the sidewall film 9 remains on the side surfaces of the gate electrode 6 in the transistor portion 101. Also, the portion of the sidewall film 9 that covers the resistive interconnection 7 in the resistance portion 102 remains without being removed by the anisotropic etching.

Figure 9:
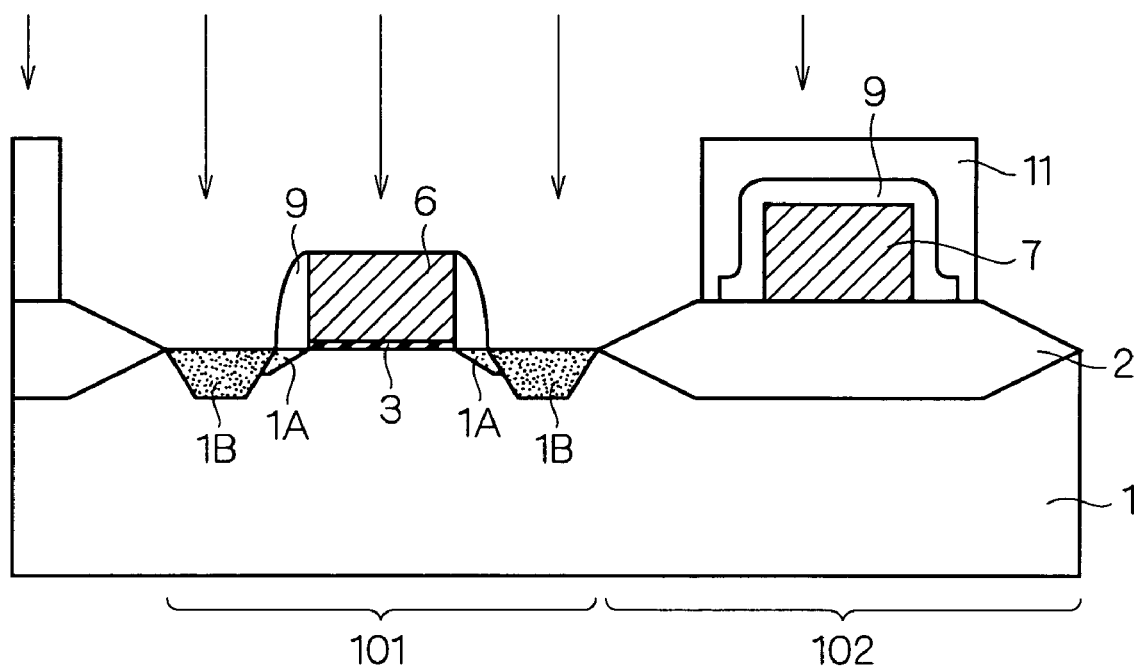

Next, as shown in FIG. 9, in the resistance portion 102, a resist 11 is formed by lithography to cover the resistive interconnection 7 (including the sidewall film 9 covering the resistive interconnection 7). The transistor portion 101 is thus exposed. Then, in this condition, impurity ions of a given conductivity type are implanted into the substrate 1 at both sides of the gate electrode 6 to form deep source/drain regions (they can be regarded as deep diffusion layers) 1B with a relatively high impurity concentration. This ion implantation is achieved by implanting impurity ions to $1\times10^{15}$ ions/cm$^2$ or more, for example.

In this ion implantation, the impurity ions are not implanted into the resistive interconnection 7 because the resistive interconnection 7 is covered by the sidewall film 9 and the resist 11. Even only the sidewall film 9 formed on the resistive interconnection 7 can suppress the introduction of the impurity ions into the resistive interconnection 7.

It is thus possible to prevent the resistance value of the resistive interconnection 7 from being varied from the initially set value by this ion implantation.

Subsequently, the resist 11 is removed and a heat treatment at about 700° C. or higher is performed to activate the source/drain regions 1A and 1B in the areas of the substrate 1 on both sides of the gate electrode 7. Now, because the resistive interconnection 7 is completely covered by the sidewall film 9, it is possible in the heat treatment to prevent out-diffusion of impurity ions contained in the resistive interconnection 7. Therefore the initially set resistance value is not varied by the heat treatment.

As described so far, in a semiconductor device having transistors and the resistive interconnection 7, the semiconductor device manufacturing method of this preferred embodiment is capable of preventing the problem that the resistance value of the resistive interconnection 7 set by the resistance-raising impurity ion implantation is varied by the impurity ion implantation and heat treatment processes that are performed later, thereby providing a semiconductor device with higher-precision resistive interconnection 7.

While the sidewall film 9 is formed to completely cover the resistive interconnection 7 in order to prevent out-diffusion of the impurity ions from the resistive interconnection 7, the formation of the sidewall film 9 is performed simultaneously with the formation of the sidewall film 9 on the side surfaces of the gate electrode 6.

Therefore no extra heat treatment is needed to form the sidewall film 9 completely covering the resistive interconnection 7, which suppresses variation of transistor characteristics and provides higher-precision transistors than those manufactured by conventional techniques.

Also, while some additional process steps are performed to form the resistive interconnection 7 and the sidewall film 9 covering the resistive interconnection 7, these steps do not vary the transistor characteristics. Furthermore, since other process steps are conventional transistor formation steps, the transistor characteristics are not particularly varied by the above-mentioned additional process steps throughout the entire manufacturing process of this preferred embodiment.

<Second Preferred Embodiment>

The semiconductor device manufacturing method according to a second preferred embodiment is characterized in that impurity ions are implanted simultaneously into the substrate areas on both sides of the gate electrode and into the resistive interconnection so as to form shallow source/drain regions and to control the resistance of the resistive interconnection.

The semiconductor device manufacturing method of this preferred embodiment is now described referring to the enlarged cross-sectional views showing the process steps.

First, the substrate 1 shown in FIG. 2 is prepared as described in the first preferred embodiment. Subsequently, in the semiconductor device manufacturing method of this preferred embodiment, before a process step of raising the resistance of the resistive interconnection 7 (i.e. skipping the process step of FIG. 3), the polysilicon 4 is patterned into a given shape as shown in FIG. 4 to form the gate electrode 6 in the transistor portion 101 and the resistive interconnection 7 in the resistance portion 102.

Figure 10:
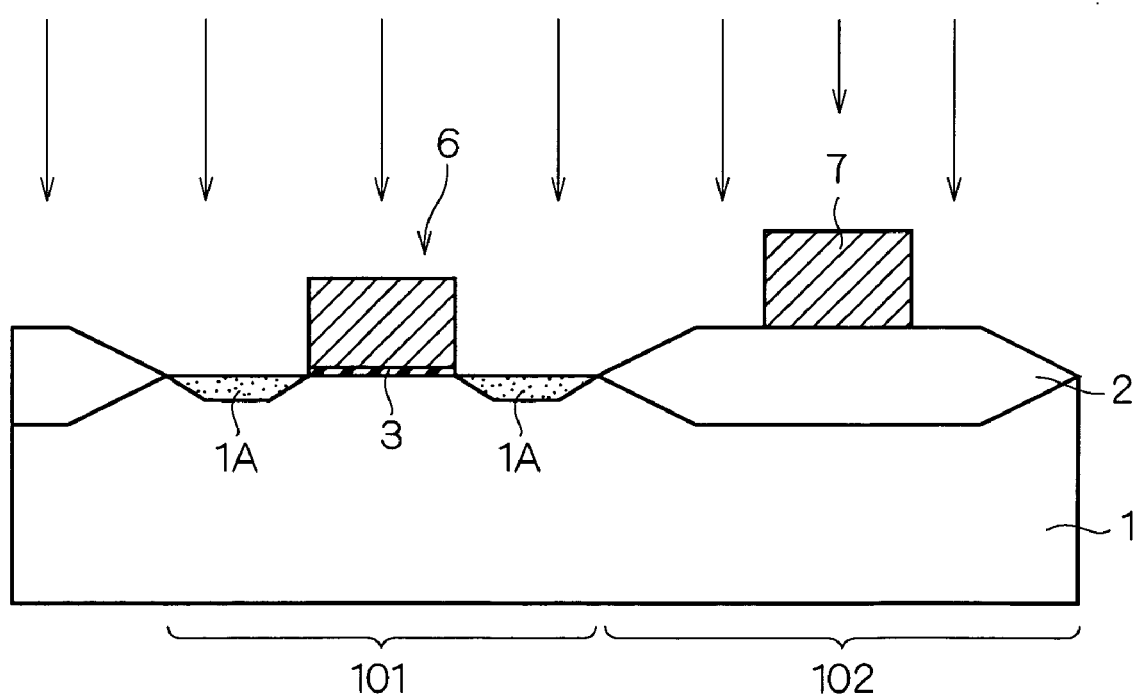
FIG. 10 is a cross-sectional view illustrating a manufacturing method according to a second preferred embodiment.

Next, as shown in FIG. 10, impurity ions are implanted into the exposed transistor portion 101 and resistance portion 102 in order to form shallow source/drain regions 1A in the transistor portion 101 and, in the resistance portion 102, to raise the resistance of the resistive interconnection 7 to a given value. This impurity ion implantation is performed by implanting given impurity ions at an energy of about 20 to 50 keV to about $1\times10^{12}$ to $1\times10^{15}$ ions/cm$^2$, for example.

Next, as shown in FIG. 6, sidewall film 9 is formed, e.g. by CVD, to a film thickness of about 40 to 200 nm, thereby covering the semiconductor device processed as shown in FIG. 10. Subsequently, with the resist 10 formed by lithography on the resistive interconnection 7 in the resistance portion 102 (FIG. 7), a normal anisotropic etching process is applied and then the resist 10 is removed.

Thus, as shown in FIG. 8, the sidewall film 9 remains on the side surfaces of the gate electrode 6 in the transistor portion 101, and in the resistance portion 102, the sidewall film 9 covering the resistive interconnection 7 remains without being removed by the anisotropic etching.

The following process steps are the same as those of the first preferred embodiment and therefore not described again here.

The manufacturing method of this preferred embodiment thus simultaneously achieves the formation of the shallow source/drain regions 1A and the resistance raise of the resistive interconnection 7, which reduces the number of process steps and consequently reduces the cost, while providing the effects of the first preferred embodiment.

<Third Preferred Embodiment>

In the semiconductor device manufacturing method of a third preferred embodiment, the sidewall film is etched using a resist covering the resistive interconnection as a mask so that the sidewall film remains on the resistive interconnection, and characteristically, that resist is then reused as a mask to implant impurity ions to form the deep source/drain regions 1B.

Figure 11:
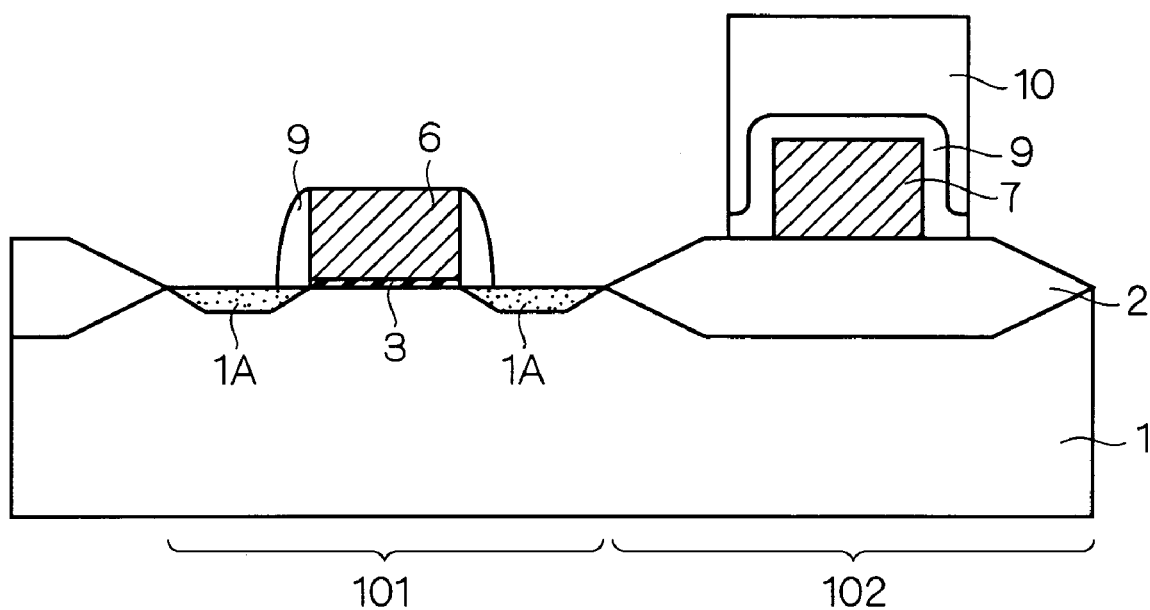
FIGS. 11 and 12 are cross-sectional views illustrating a manufacturing method according to a third preferred embodiment.

The semiconductor device manufacturing method of this preferred embodiment is now described referring to the enlarged cross-sectional views showing the process steps. This method uses the process steps of FIGS. 1 to 7 and the subsequent anisotropic etching step as described in the first preferred embodiment and therefore they are not described in detail again. FIG. 11 shows the structure obtained after the anisotropic etching.

As shown in FIG. 11, as in the first preferred embodiment, the sidewall film 9 remains on the sides of the gate electrode 6 and also on the side surfaces and the top surface of the resistive interconnection 7 since the resistive interconnection 7 is covered by the resist 10.

Figure 12:
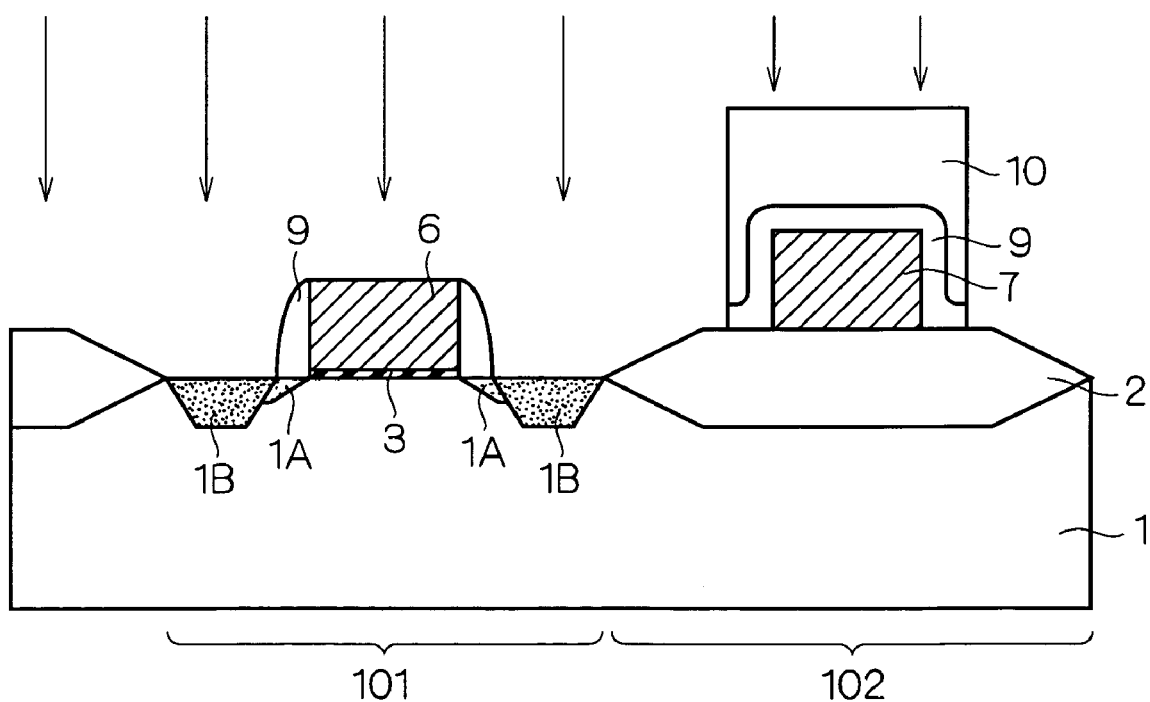

Next, in this preferred embodiment, as shown in FIG. 12, without removing the resist 10, an impurity ion implantation is performed to form the deep source/drain regions 1B in the substrate 1 on both sides of the gate electrode 6. This ion implantation is achieved by implanting impurity ions of $1\times10^{15}$ ions/cm$^2$ or more, for example.

Subsequently, the resist 10 is removed and a heat treatment at about 700° C. or higher is performed to activate the source/drain regions 1A and 1B in the substrate 1 on both sides of the gate electrode 6. In this process step, as in the first preferred embodiment, it is possible to prevent impurity ions from diffusing out from the resistive interconnection 7 due to this heat treatment because the resistive interconnection 7 is completely covered by the sidewall film 9. Therefore the initially set resistance value is not varied by this heat treatment.

As described above, according to the manufacturing method of this preferred embodiment, the resist 10 is not removed after the etching of the sidewall film 9 and the impurity ion implantation for forming the deep source/drain regions 1B is performed using that resist 10. This preferred embodiment thus reduces the number of process steps as compared with the first preferred embodiment and consequently reduces the cost while providing the effects of the first preferred embodiment.

Although the third preferred embodiment has shown a method in which the patterning of the sidewall film 9 and the formation of the deep source/drain regions 1B described in the first preferred embodiment are achieved using the same resist 10 as a mask, the manufacturing method of the third preferred embodiment can be applied also to the second preferred embodiment.

That is to say, while the method shown in the second preferred embodiment achieves the patterning of the sidewall film 9 and the formation of the deep source/drain regions 1B using separate resists, the same resist 10 may be used as a mask in common in the two process steps.

As stated above, this reduces the number of process steps and thus reduces the cost, while providing the effects of the second preferred embodiment.

<Fourth Preferred Embodiment>

In the manufacturing methods of the preferred embodiments above, the sidewall film 9 completely covers the resistive interconnection 7 but the sidewall film 9 is absent on the top surface of the gate electrode 6.

In this condition, let us suppose that an interlayer insulating film is deposited to cover the resistive interconnection 7 and the gate electrode 6, and an interconnection is provided on the interlayer insulating film, and a first contact hole connecting that interconnection and the gate electrode 6 and a second contact hole connecting that interconnection and the resistive interconnection 7 are simultaneously formed. In this case, the etching conditions differ between the two contact holes.

Then, when the two contact holes are etched at the same time, the process margin is necessarily reduced.

Accordingly, the manufacturing method of this preferred embodiment includes an additional step of forming openings in given positions of the sidewall film 9 covering the top surface of the resistive interconnection 7 before covering the gate electrode 6 and the resistive interconnection 7 with an interlayer insulating film. This is now described in detail.

Figure 13:
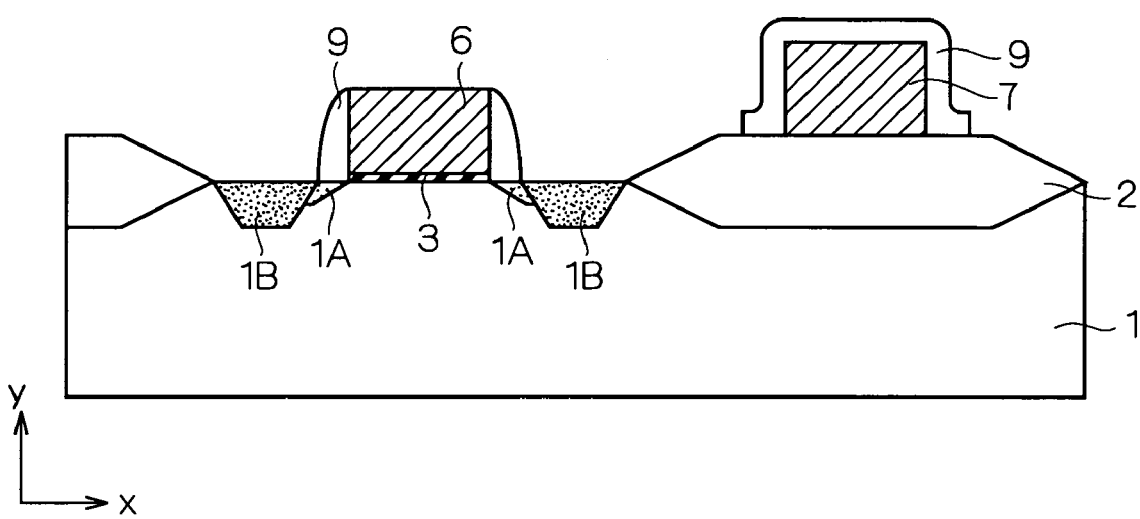
FIGS. 13 to 16 are cross-sectional views illustrating a manufacturing method according to a fourth preferred embodiment.
Figure 14:
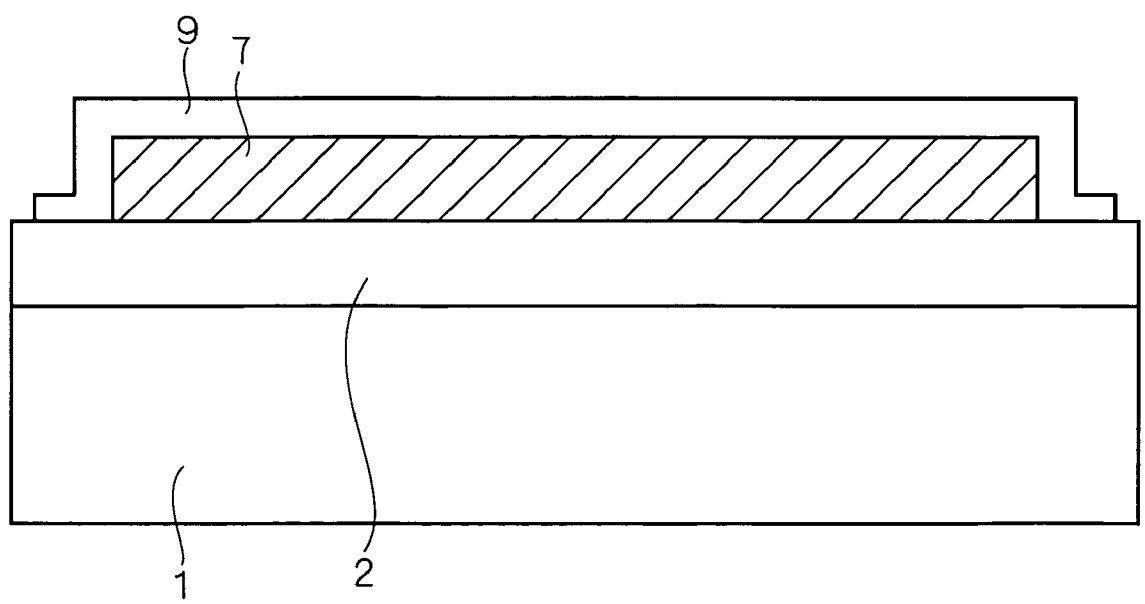

FIG. 13 is a cross-sectional view of the semiconductor device being processed according to the manufacturing methods of the preferred embodiments described so far. FIG. 14 is an enlarged cross-sectional view of the semiconductor device of FIG. 13, in which the resistive interconnection 7 is cut along a section parallel to the axis y and that cross-section is seen in the direction x.

Figure 15:
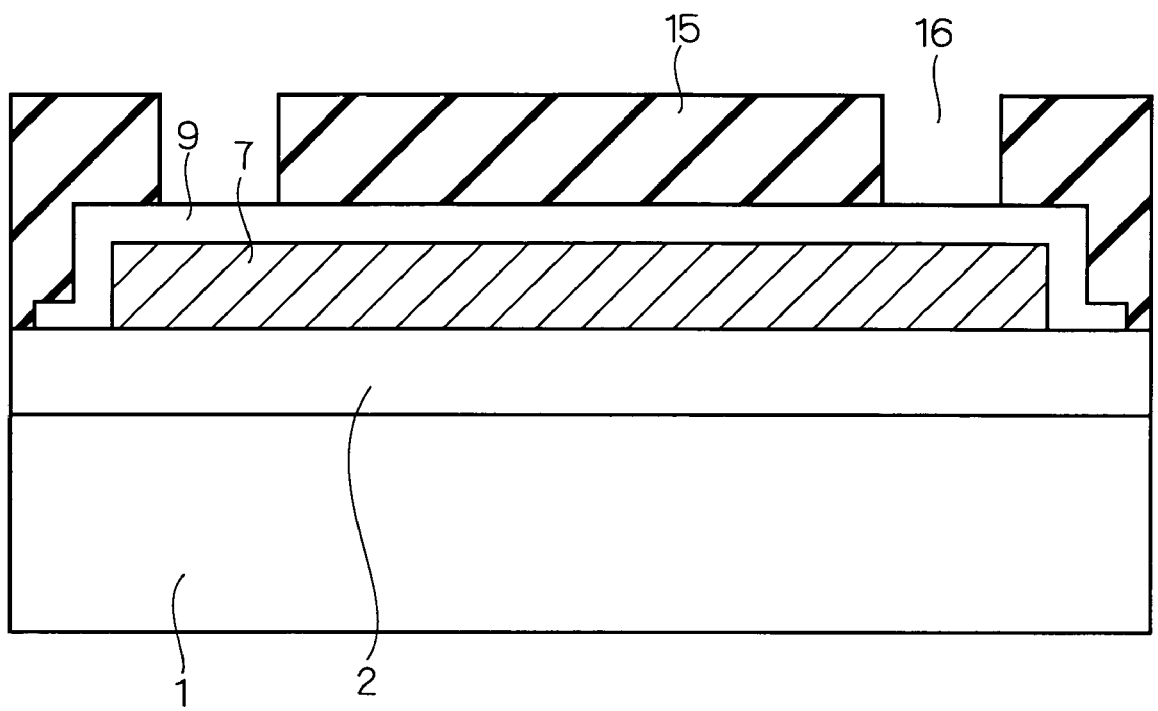

As shown in FIG. 14, after forming the sidewall film 9 covering the resistive interconnection 7 as described in the above-described preferred embodiments, a resist 15 is formed to cover the sidewall film 9 and then openings 16 reaching the sidewall film 9 are formed in given positions of the resist 15. This is shown in FIG. 15.

Figure 16:
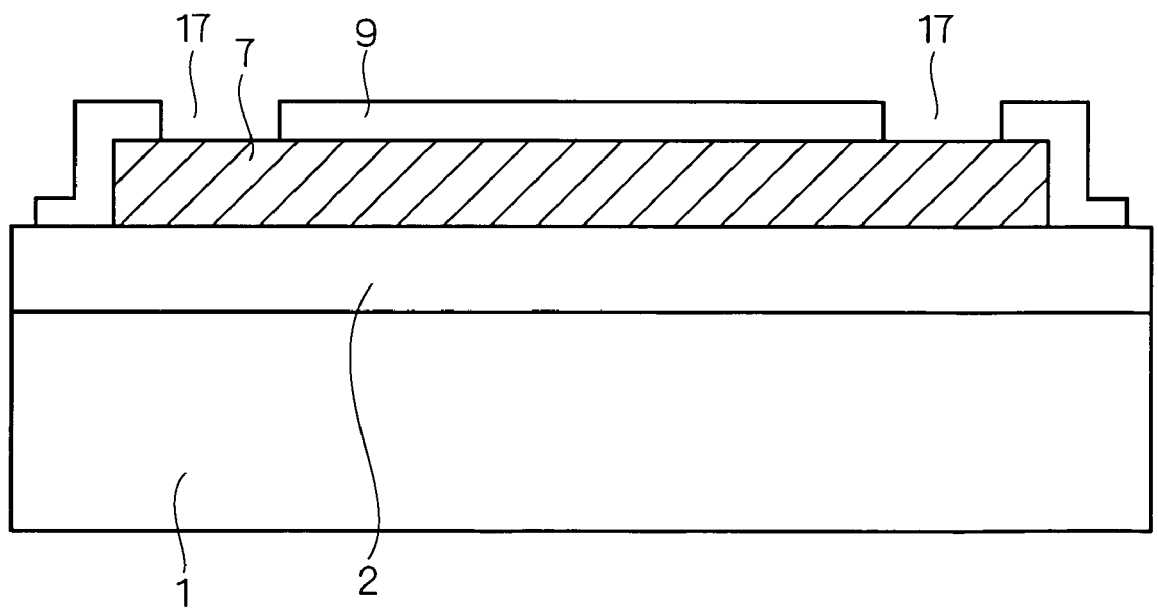
Figure 17:
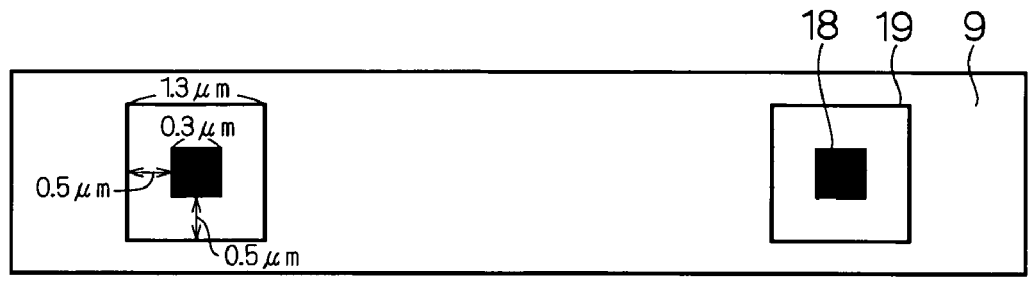
FIG. 17 is a plan view used to explain the sizing of openings with respect to the sizing of contact areas with via plugs.

Next, the sidewall film 9 is etched using the resist 15 as a mask to form openings 17 reaching the resistive interconnection 7 through the sidewall film 9. FIG. 16 shows the structure obtained after removal of the resist 15. FIG. 17 is the plan view of the structure shown in FIG. 16.

For example, the openings 17 are formed with a margin of 0.5 μm with respect to contact regions with via plugs formed later. For example, as shown in FIG. 17, when a contact region 18 is a square area having sides of 0.3 μm, then, in plan view, the opening 17 is formed in a square area 19 having sides of 1.3 μm, with a margin of 0.5 μm from each side of the square area of the contact region 18.

Figure 18:
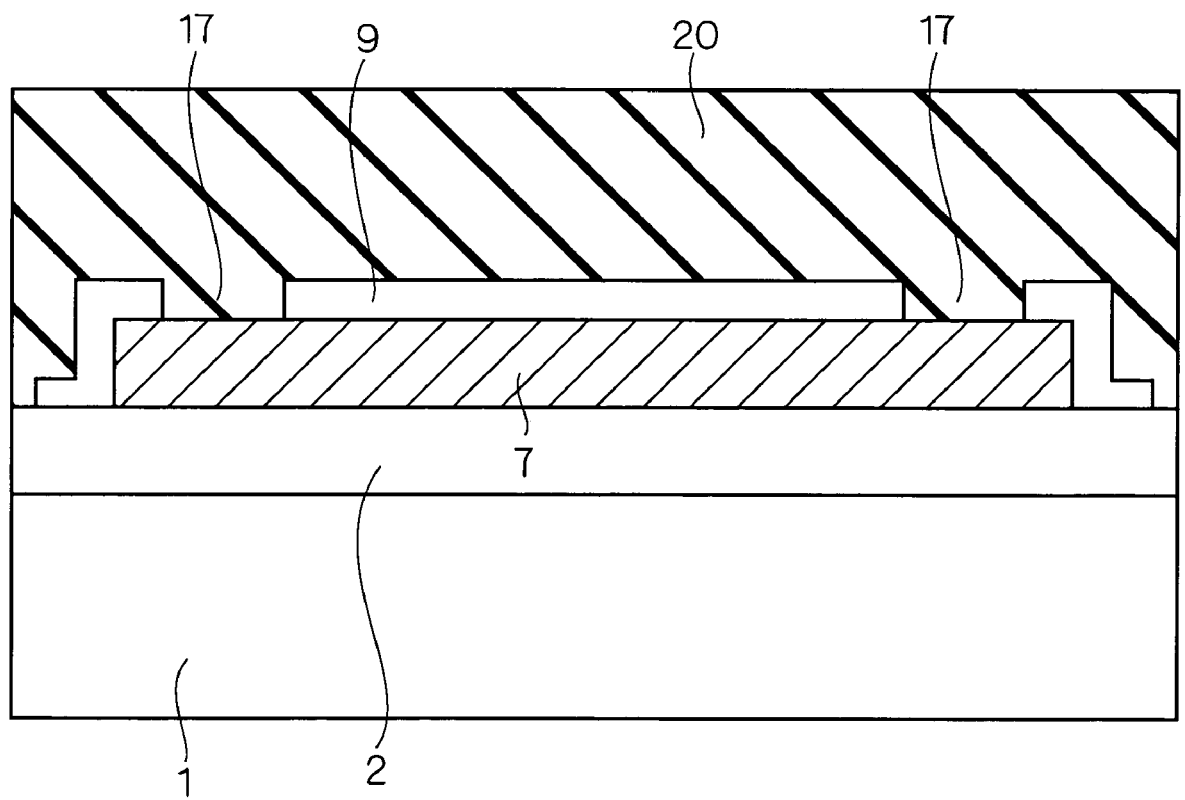
FIGS. 18 to 20 are cross-sectional views illustrating the manufacturing method of the fourth preferred embodiment.

Next, as shown in FIG. 18, an interlayer insulating film 20 is formed by, e.g. CVD, covering the resistive interconnection 7 and the gate electrode 6 (not shown).

Figure 19:
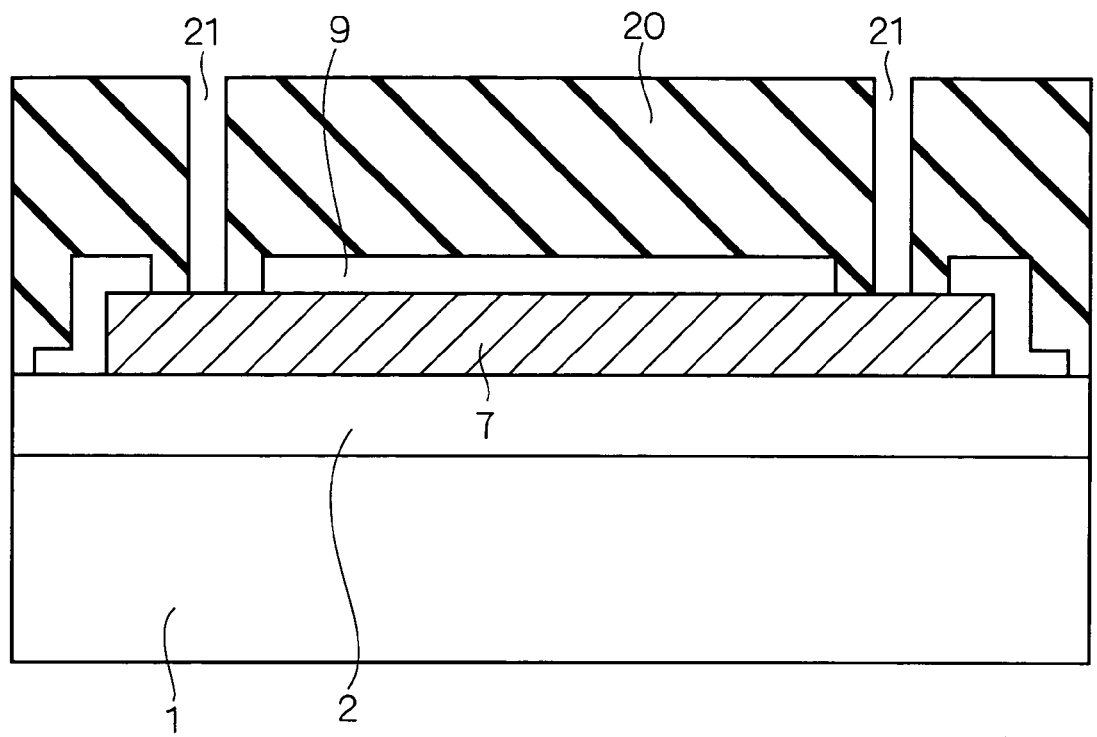

Next, a normal lithography technique is applied to form second contact holes 21 reaching the resistive interconnection 7 through the interlayer insulating film 20 (FIG. 19) and at the same time a first contact hole (not shown) is formed to reach the gate electrode 6 through the interlayer insulating film 20.

Figure 20:
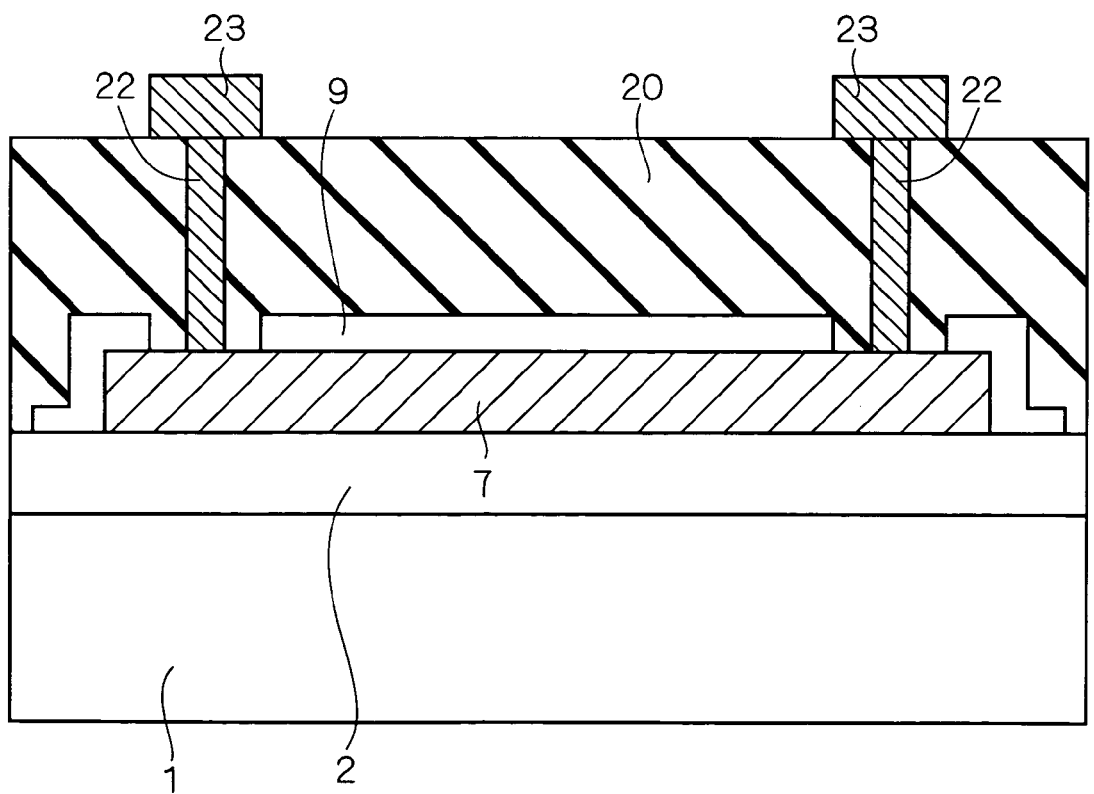

Subsequently, the first contact hole and the second contact holes 21 are filled with a conductor to form via plugs 22 and then interconnections 23 are formed on the surface of the interlayer insulating film 20. The interconnections 23 include ones that are electrically connected to the resistive interconnection 7 through the via plugs 22 (FIG. 20) and one (not shown) that is electrically connected to the gate electrode 6 through a via plug.

As discussed above, in the manufacturing method of this preferred embodiment, before the formation of the interlayer insulating film 20, the openings 17 reaching the resistive interconnection 7 are formed in given areas of the sidewall film 9 covering the top surface of the resistive interconnection 7. This improves the process margin of the formation of the first contact hole and second contact holes 21 through the interlayer insulating film 20.

<Fifth Preferred Embodiment>

The semiconductor device manufacturing method of a fifth preferred embodiment is characterized in that, after the etching using the resist 15 as a mask as shown in FIG. 15 to form the openings 17 in the sidewall film 9, impurity ions are implanted into the areas exposed in the openings 17 to lower the resistance value of the resistive interconnection 7 in these areas. This is now described in detail.

Figure 21:
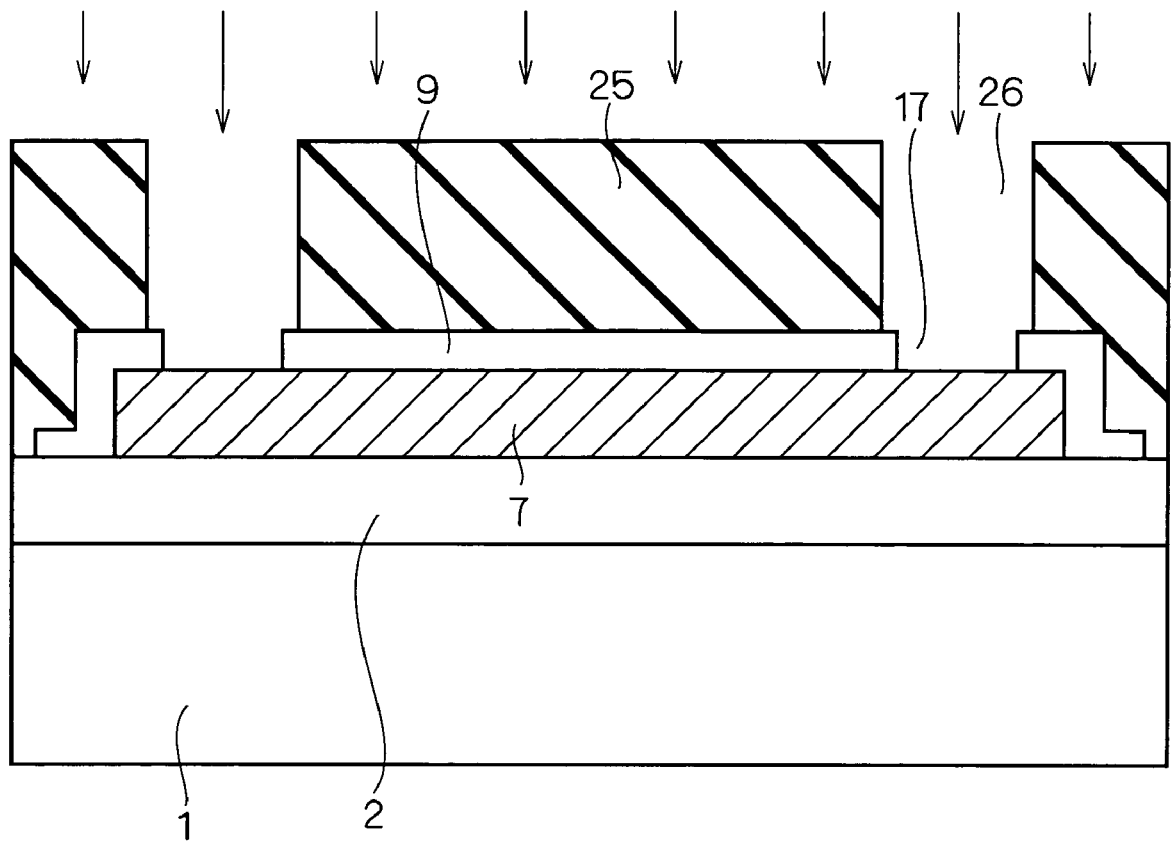
FIG. 21 is a cross-sectional view illustrating a manufacturing method according to a fifth preferred embodiment.

After processing the semiconductor device to the step shown in FIG. 16, a resist 25 is formed to cover the semiconductor device and then openings 26 are formed through the resist 25 from its top surface so that the resistive interconnection 7 is exposed in the previously formed openings 17. Next, impurity ions are implanted using the resist 25 as a mask. FIG. 21 shows this process step. This impurity ion implantation can be performed under the conditions below.

For example, the impurity ion implantation can be conducted using As, $BF_2$ as the ion species with an implant energy of about 20 to 50 keV and an impurity ion concentration of about $1 \times 10^{14}$ to $1 \times 10^{16}$ ions/cm$^2$.

Impurity ions are thus implanted into the portions of the resistive interconnection 7 that are exposed in the openings 26, so that the contact resistance in these implanted portions with respect to via plugs formed later is made lower than when the impurity ion implantation is not performed.

For example, the impurity ion implantation under the conditions shown above lowers the contact resistance to (1/several numbers) or (1/several decades) of the contact resistance that would be exhibited when the impurity ion implantation is not performed.

Accordingly, the ratio of the contact resistance value to the resistance value of the resistive interconnection 7 is reduced, so that, even when the contact resistance values vary among the resistive interconnections 7, the effect of the variation upon the resistance value of the entire resistive interconnections 7 is reduced, which provides more precise resistive interconnections 7.

The impurity ion implantation for forming the deep source/drain regions may be achieved simultaneously with this impurity ion implantation.

<Sixth Preferred Embodiment>

The semiconductor device manufacturing method of a sixth preferred embodiment is characterized in that an insulating film is formed to cover the resistive interconnection to prevent out-diffusion of impurities from the resistive interconnection during the heat treatment of the semiconductor device. That is to say, while the first and other preferred embodiments use the sidewall film also as such insulating film, this preferred embodiment characteristically forms a separate insulating film.

The semiconductor device manufacturing method of this preferred embodiment is now described referring to the enlarged cross-sectional views showing the process steps.

First, as in the second preferred embodiment, a heat treatment is applied to the substrate 1 having element isolation films 2 to form the gate oxide film 3 and then the polysilicon 4 is formed to cover the substrate 1 on which the gate oxide film 3 resides. Then the polysilicon 4 is patterned to form the gate electrode 6 and the resistive interconnection 7 (see FIGS. 1, 2, 4).

Next, as described referring to FIG. 5 in the first preferred embodiment, impurity ions are implanted, with the resistive interconnection 7 covered by the resist 8, in order to form the shallow source/drain regions 1A in the surface of the substrate 1 on both sides of the gate electrode 6. Subsequently, as shown in FIG. 6, the sidewall film 9 is formed over the substrate 1 to cover the gate electrode 6 and the resistive interconnection 7.

Figure 22:
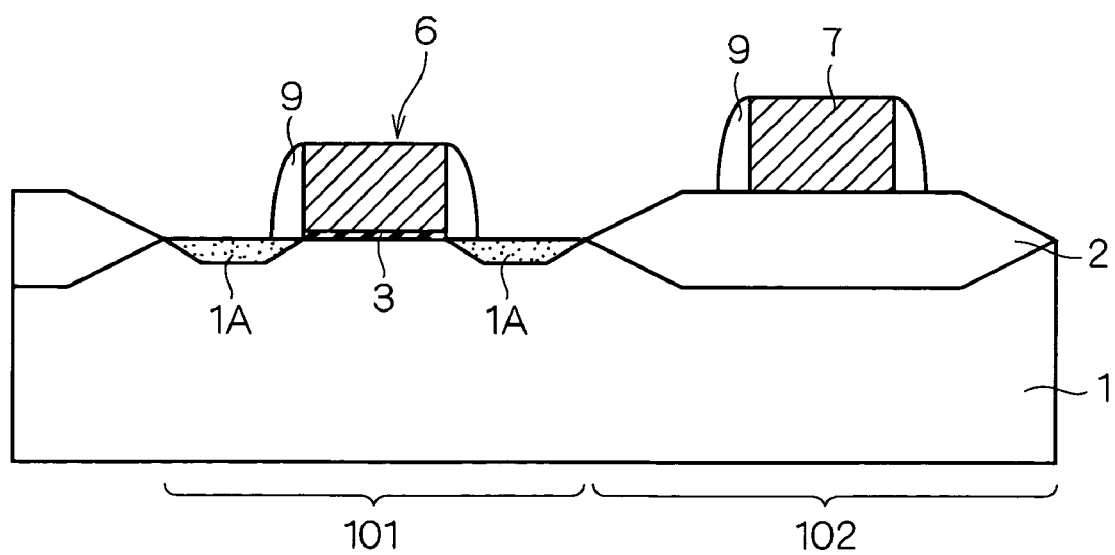
FIGS. 22 to 26 are cross-sectional views illustrating a manufacturing method according to a sixth preferred embodiment.

Next, in the manufacturing method of this preferred embodiment, the entire surface of the sidewall film 9 formed over the substrate 1 is anisotropically etched with no resist covering the resistive interconnection 7. As shown in FIG. 22, this etching causes the sidewall film 9 to remain on the side surfaces of the gate electrode 6 and also on the side surfaces of the resistive interconnection 7.

It should be noted that, in this preferred embodiment, the sidewall film 9 does not remain on the top surface of the resistive interconnection 7 but it remains only on both side surfaces of the resistive interconnection 7.

Figure 23:
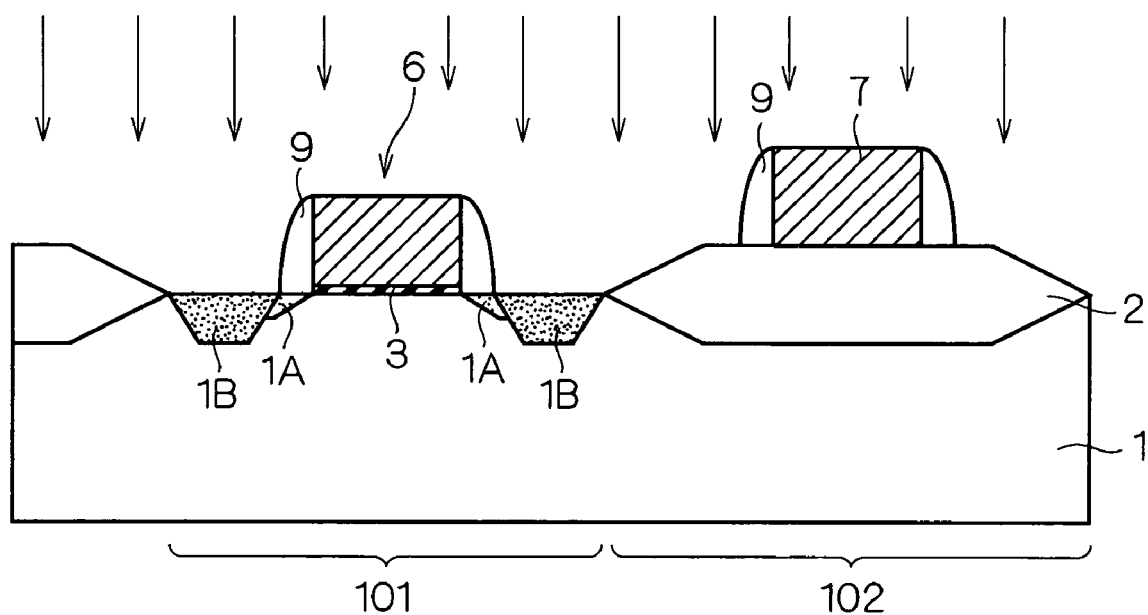

Next, as shown in FIG. 23, impurity ions are implanted into the substrate 1 at a high concentration (for example, about $1 \times 10^{14}$ to $1 \times 10^{16}$ ions/cm$^2$) in order to form the deep source/drain regions 1B in the surface portions of the substrate 1 on both sides of the gate electrode 6 and also in order to control the resistance value of the resistive interconnection 7.

The single ion implantation process thus achieves both of the formation of the deep source/drain regions 1B and the resistance value control of the resistive interconnection 7, which reduces the manufacturing cost.

Figure 24:
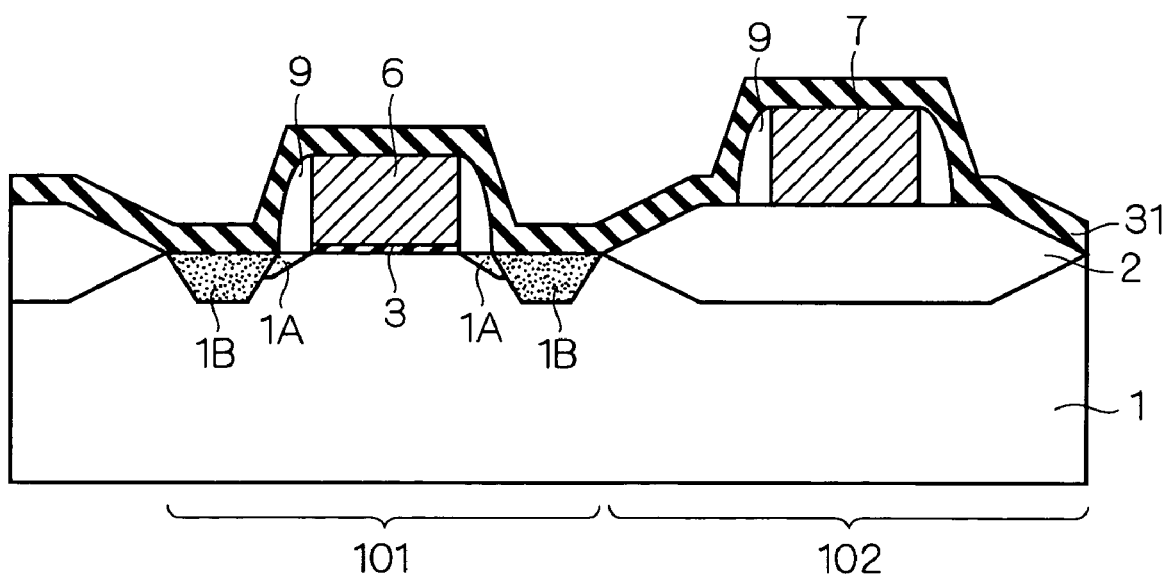

Next, as shown in FIG. 24, an insulating film 31 is formed over the substrate 1 by CVD to cover the gate electrode 6 and the resistive interconnection 7. The insulating film 31 can be a silicon oxide film or a silicon nitride film ($Si_3N_4$), for example. The thickness of the insulating film 31 is about 50 to 200 nm.

Figure 25:
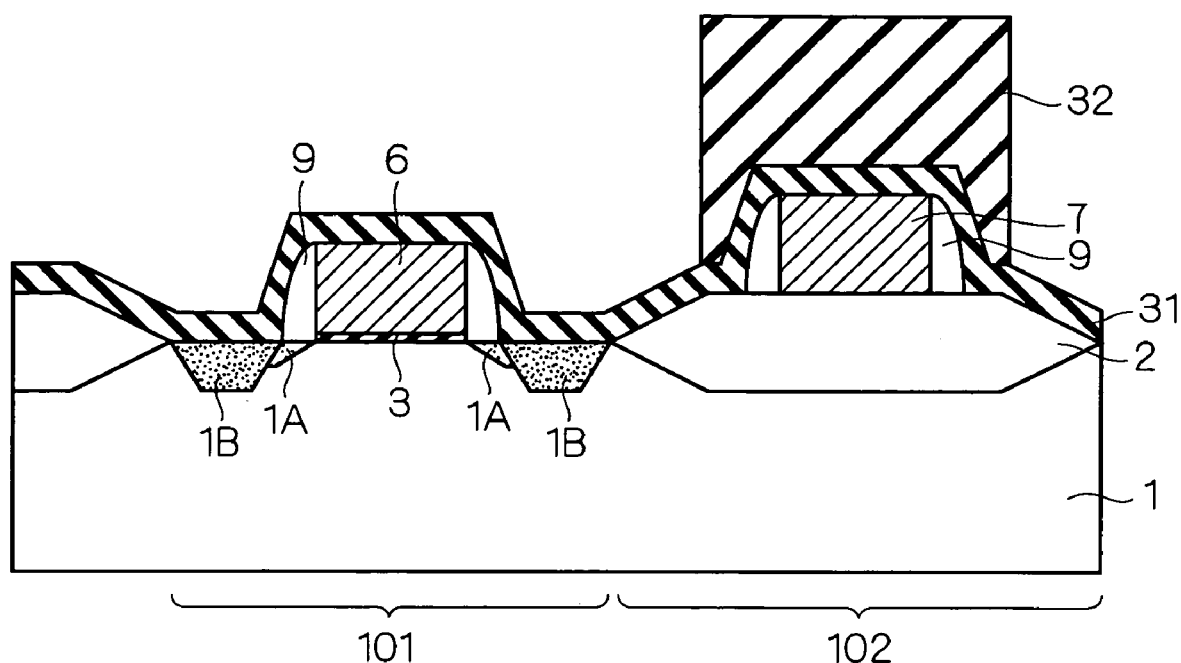

Next, as shown in FIG. 25, a resist 32 is formed by a normal lithography technique to cover the resistive interconnection 7 that is covered by the insulating film 31, which is followed by an anisotropic etching using the resist 32 as a mask.

Figure 26:
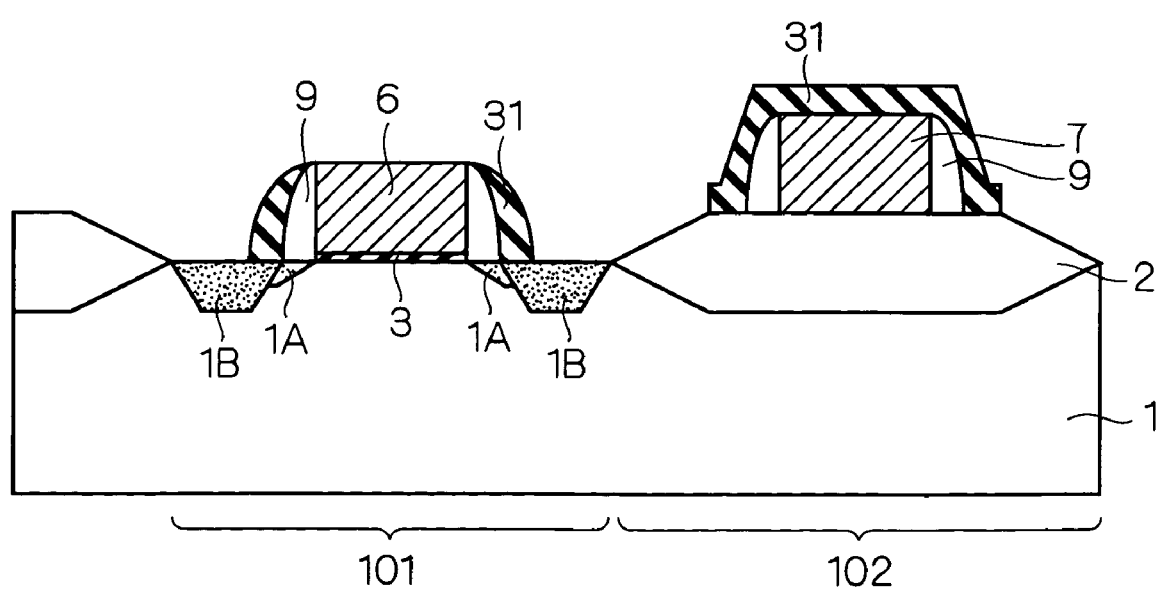

FIG. 26 shows the structure obtained after the etching, from which the resist 32 has been removed. As can be seen from FIG. 26, the sidewall film 9 and insulating film 31 remain on the side surfaces of the gate electrode 6, and the sidewall film 9 and insulating film 31 remain also on the side surfaces of the resistive interconnection 7, with the insulating film 31 remaining on the top surface of the resistive interconnection 7.

Subsequently, a heat treatment at about 700° C. or higher is performed to activate the source/drain regions 1A and 1B formed in the substrate 1 on both sides of the gate electrode 6. This heat treatment does not cause out-diffusion of impurity ions from the resistive interconnection 7 because the resistive interconnection 7 is completely covered by the insulating film 31. Therefore the initially set resistance value is not varied by the heat treatment.

In the fourth preferred embodiment, the openings 17 are formed in the sidewall film 9 prior to the formation of the interlayer insulating film 20 (see FIGS. 16 and 18) so as to improve the process margin of the subsequent formation of the first and second contact holes. In this preferred embodiment, as in the fourth preferred embodiment, openings can be formed in the insulating film 31 prior to the formation of the interlayer insulating film 20 to improve the process margin of the formation of the first and second contact holes.

Also, adopting a nitride film having a film thickness of 50 nm or more as the insulating film 31 prevents hydrogen from invading the resistive interconnection 7. This suppresses variation of the resistance value of the resistive interconnection 7 and so improves the long-term reliability of the resistive interconnection 7.

<Seventh Preferred Embodiment>

The semiconductor device manufacturing method of a seventh preferred embodiment is characterized in that a silicide protection film is adopted as the insulating film 31 introduced in the sixth preferred embodiment. That is to say, characteristically, a silicide protection film, which is usually used during silicidation process to cover regions not to undergo silicidation, serves also as an insulating film for preventing the out-diffusion of impurity ions from the resistive interconnection.

Figure 27:
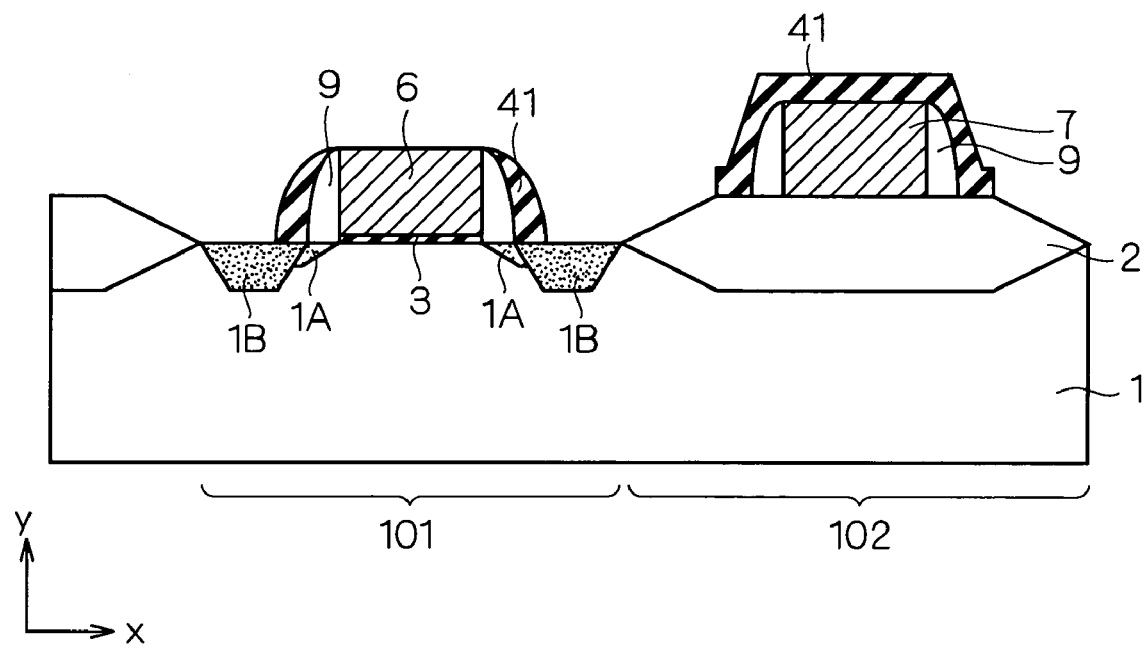
FIG. 27 is a cross-sectional view illustrating a semiconductor device according to a seventh preferred embodiment.

The manufacturing process steps of this preferred embodiment are conducted in the same way as those of the sixth preferred embodiment except that the insulating film 31 of the sixth preferred embodiment is replaced by a silicide protection film. Therefore they are not described again here. FIG. 27 is a cross-sectional view of the semiconductor device of this preferred embodiment.

As can be seen from FIG. 27, sidewall films 9 and silicide protection films 41 are formed on the side surfaces of the gate electrode 6 and the sidewall films 9 are formed on the side surfaces of the resistive interconnection 7, with the silicide protection film 41 covering the resistive interconnection 7 on which the sidewall films 9 reside.

Thus, when a manufacturing process includes a silicidation step, like this preferred embodiment, it is not necessary to form a separate insulating film only for the purpose of preventing impurity ion out-diffusion from the resistive interconnection 7, meaning that there is no need to apply extra heat treatment to the semiconductor device to form such insulating film.

Thus, when a silicidation process is included, it is possible to prevent the out-diffusion of impurity ions from the resistive interconnection 7 and to suppress variation of transistor characteristics, thereby providing more precise transistors as compared with those of the sixth preferred embodiment.

<Eighth Preferred Embodiment>

In the fifth preferred embodiment, impurity ions are implanted into the resistive interconnection 7 in the regions that come in contact with via plugs, so as to lower the contact resistance with the via plugs (see FIG. 21). The semiconductor device manufacturing method of an eighth preferred embodiment is characterized in that those contact regions are salicidized. This is now described in detail.

Figure 28:
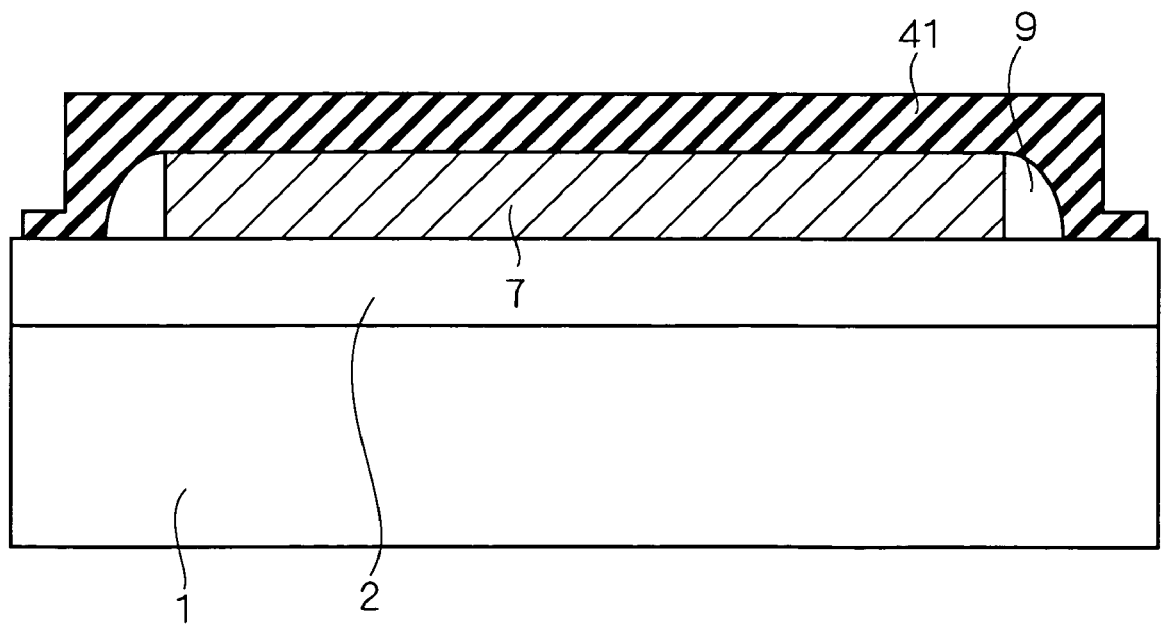
FIGS. 28 to 30 are cross-sectional views illustrating a manufacturing method according to an eighth preferred embodiment.

FIG. 28 is an enlarged cross-sectional view of the semiconductor device of FIG. 27, where the resistive interconnection 7 is cut along a section parallel to the axis y and the section is seen from the direction x.

Next, in FIG. 28, according to a procedure similar to that of the fourth preferred embodiment, openings 42 reaching the resistive interconnection 7 are formed in given positions of the silicide protection film 41 covering the resistive interconnection 7. This step is shown in FIG. 29.

Figure 29:
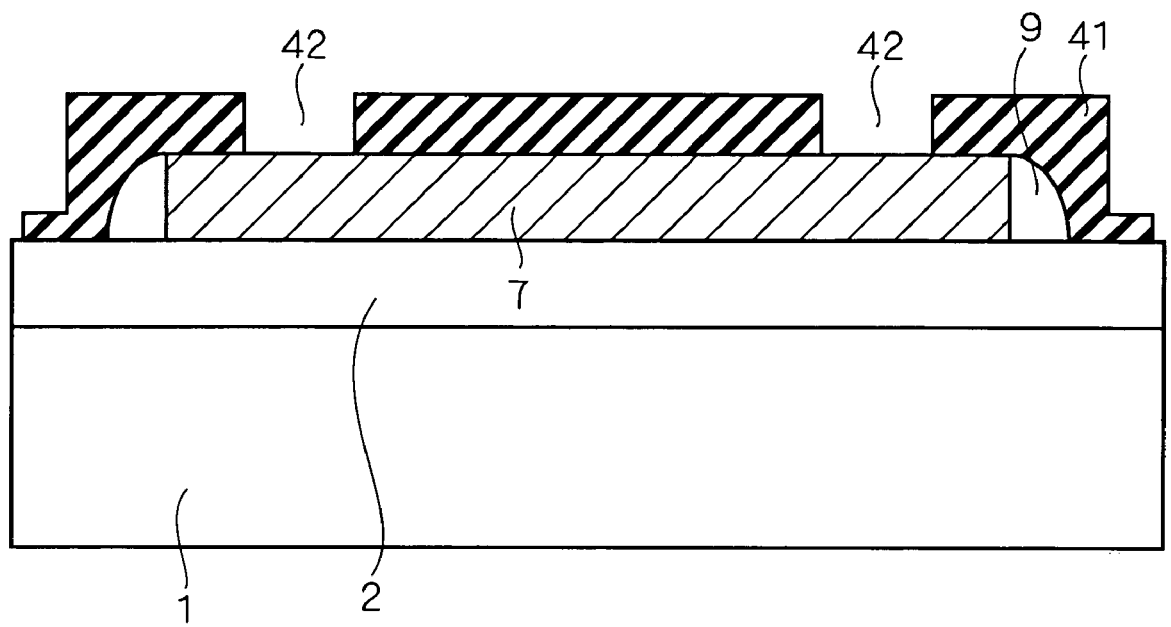
Figure 30:
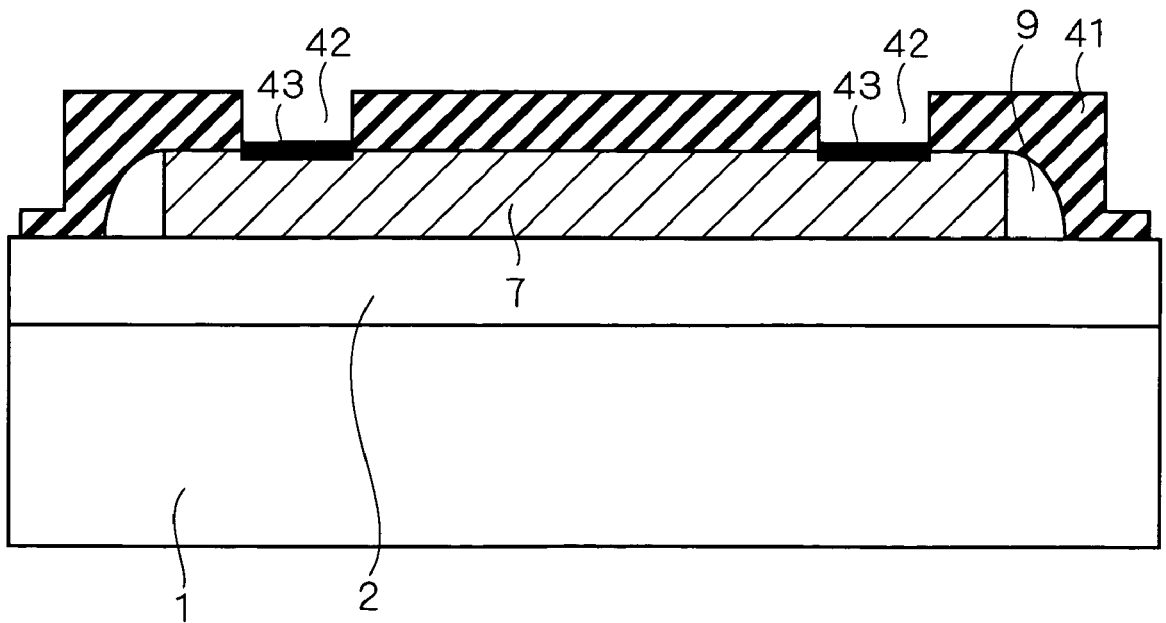

Next, a sputtering is applied to the semiconductor device processed as shown in FIG. 29 to deposit a refractory metal, such as cobalt, titanium, or nickel, on the semiconductor device. Then the semiconductor device, on which the refractory metal has been deposited, is thermally processed. This forms silicide films 43 in a self-aligned manner on the surface of the resistive interconnection 7 in the areas exposed at the bottoms of the openings 42. Then the refractory metal portion formed on the silicide protection film 41 and therefore remaining unreacted during the heat treatment is removed by wet-etching. FIG. 30 is an enlarged cross-sectional view showing the structure after the removal.

The following process steps, i.e. forming an interlayer insulating film, forming contact holes, and so on, are carried out just like those of the fourth preferred embodiment, so these steps are not described again here.

In this way, in the manufacturing method of this preferred embodiment, before the formation of the interlayer insulating film, the openings 42 reaching the resistive interconnection 7 are formed in given positions of the silicide protection film 41 covering the upper surface of the resistive interconnection 7 and the surface portions of the resistive interconnection 7 exposed at the bottoms of the openings 42 are subjected to salicidation. Thus the contact resistance of the salicided portions (silicide films 43) with respect to the via plugs formed later is lowered to (1/several decades) of that exhibited when salicidation is not performed.

Accordingly, the ratio of the contact resistance value to the resistance value of the resistive interconnection 7 is reduced, so that, even when the contact resistance values vary among the resistive interconnections 7, the effect of the variation upon the resistance value of the entire resistive interconnections 7 is reduced, which provides more precise resistive interconnections 7.

While the invention has been described in detail, the foregoing description is in all aspects illustrative and not restrictive. It is understood that numerous other modifications and variations can be devised without departing from the scope of the invention.

What is claimed is:

1. A semiconductor device manufacturing method comprising the steps of:
    (a) forming a resistive interconnection and a gate electrode on a substrate;
    (b) implanting impurity ions into a surface of said substrate to form a diffusion layer;
    (c) forming an insulating film to cover said resistive interconnection and said gate electrode; and
    (d) heating said substrate after said step (c) to activate said diffusion layer, and further comprising, after said step (c), the steps of:

(e) forming an opening in said insulating film covering an upper surface of said resistive interconnection, said opening reaching said resistive interconnection;

(f) after said step (e), forming an interlayer insulating film covering said resistive interconnection and said gate electrode; and (g) forming a first contact hole extending from an upper surface of said interlayer insulating film to reach said gate electrode and forming a second contact hole extending from the upper surface of said interlayer insulating film through said opening to reach said resistive interconnection.

2. The semiconductor device manufacturing method according to claim 1, further comprising the step (h) of, after said step (e), applying a process of lowering the resistance of said resistive interconnection in a region exposed in said opening.

3. The semiconductor device manufacturing method according to claim 2, wherein said step (h) includes the step of implanting impurity ions into the region of said resistive interconnection that is exposed in said opening to lower the resistance of said resistive interconnection in that exposed region.

4. The semiconductor device manufacturing method according to claim 1, further comprising, before said step (c), the steps of:
   (i) forming sidewall films on side surfaces of said gate electrode; and
   (j) after said step (i), implanting impurity ions into said substrate on both sides of said gate electrode and into said resistive interconnection to form said diffusion layer and to control a resistance value of said resistive interconnection.

5. The semiconductor device manufacturing method according to claim 2, wherein said step (h) includes the step of applying a salicidation process to the region of said resistive interconnection that is exposed in said opening to lower the resistance of said resistive interconnection in that exposed region.

6. The semiconductor device manufacturing method according to claim 1, comprising forming said resistive interconnection on an element isolation region.

7. The semiconductor device manufacturing method according to claim 2, further comprising, before said step (c), the steps of:
   (i) forming sidewall films on side surfaces of said gate electrode; and
   (j) after said step (i), implanting impurity ions into said substrate on both sides of gate electrode and into said resistive interconnection to form said diffusion layer and to control a resistance value of said resistive interconnection.

8. A semiconductor device manufacturing method comprising the steps of:
   (a) forming a resistive interconnection and a gate electrode on a substrate;
   (b) implanting impurity ions into a surface of said substrate to form a diffusion layer;
   (c) forming an insulating film to cover said resistive interconnection and said gate electrode; and
   (d) heating said substrate after said step (c) to activate said diffusion layer, wherein said step (c) comprises the steps of:
   (c-1) forming a sidewall film on said substrate to cover said gate electrode and said resistive interconnection; and
   (c-2) selectively removing said sidewall film in such a way that said sidewall film remains on side surfaces of said gate electrode and on side and top surfaces of said resistive interconnection.

9. The semiconductor device manufacturing method according to claim 8, wherein said diffusion layer comprises shallow diffusion layers that have a relatively shallow diffusion layer depth, and
   said step (b) comprises the step (b-1) of, before said step (c), implanting impurity ions into said substrate in areas on both sides of said gate electrode and into said resistive interconnection to form said shallow diffusion layers and to control a resistance value of said resistive interconnection.

10. The semiconductor device manufacturing method according to claim 8, wherein said diffusion layer comprises deep diffusion layers that have a relatively deep diffusion layer depth,
    and wherein said step (c-2) includes the step of forming a resist to cover said resistive interconnection and performing an etching using said resist as a mask so that said sidewall film remains on the side surfaces of said gate electrode and on the side and top surfaces of said resistive interconnection, and
    said step (b) comprises the step (b-2) of implanting impurity ions into said substrate in areas on both sides of said gate electrode using said resist as a mask to form said deep diffusion layers.

11. The semiconductor device manufacturing method according to claim 9, wherein said diffusion layer comprises deep diffusion layers that have a relatively deep diffusion layer depth,
    and wherein said step (c-2) includes the step of forming a resist to cover said resistive interconnection and performing an etching using said resist as a mask so that said sidewall film remains on the side surfaces of said gate electrode and on the side and top surfaces of said resistive interconnection, and
    said step (b) comprises the step (b-2) of implanting impurity ions into said substrate in areas on both sides of said gate electrode using said resist as a mask to form said deep diffusion layers.

12. The semiconductor device manufacturing method according to claim 8, further comprising, before said step (c), the steps of:
    (i) forming sidewall films on the side surfaces of said gate electrode; and
    (j) after said step (i), implanting impurity ions into said substrate on both sides of said gate electrode and into said resistive interconnection to form said diffusion layer and to control a resistance value of said resistive interconnection.

13. The semiconductor device manufacturing method according to claim 8, comprising forming said resistive interconnection on an element isolation region.

14. A semiconductor device manufacturing method comprising the steps of:
    (a) forming a resistive interconnection and a gate electrode on a substrate;
    (b) implanting impurity ions into a surface of said substrate to form a diffusion layer;
    (c) forming an insulating film to cover said resistive interconnection and said gate electrode; and
    (d) heating said substrate after said step (c) to activate said diffusion layer, wherein said step (c) comprises the steps of:

(c-3) forming a silicide protection film on said substrate to cover said gate electrode and said resistive interconnection; and (c-4) selectively removing said silicide protection film so that said silicide protection film remains to cover side surfaces of said gate electrode and top and side surfaces of said resistive interconnection.

15. The semiconductor device manufacturing method according to claim 14, further comprising, before said step (c), the steps of:

(i) forming sidewall films on side surfaces of said gate electrode; and (j) after said step (i), implanting impurity ions into said substrate on both sides of gate electrode and into said resistive interconnection to form said diffusion layer and to control a resistance value of said resistive interconnection.

16. The semiconductor device manufacturing method according to claim 14, comprising forming said resistive interconnection on an element isolation region.

17. A semiconductor device manufacturing method comprising the steps of:

(a) forming a resistive interconnection on an element isolation region and a gate electrode on a substrate;

(b) implanting impurity ions into a surface of said substrate to form a diffusion layer;

(c) forming an insulating film to cover said resistive interconnection and said gate electrode; and (d) heating said substrate after said step (c) to activate said diffusion layer, wherein said step (c) includes the step of forming a nitride film to cover said resistive interconnection.

18. A semiconductor device manufacturing method comprising the steps of:

(a) forming a resistive interconnection and a gate electrode on a substrate;

(b) implanting impurity ions into a surface of said substrate to form a diffusion layer;

(c) forming an insulating film to cover said resistive interconnection and said gate electrode; and (d) heating said substrate after said step (c) to activate said diffusion layer, wherein said step (c) includes the step of forming a nitride film to cover said resistive interconnection, the semiconductor device manufacturing method, further comprising, before said step (c), the steps of:

(i) forming sidewall films on side surfaces of said gate electrode; and (j) after said step (i), implanting impurity ions into said substrate on both sides of gate electrode and into said resistive interconnection to form said diffusion layer and to control a resistance value of said resistive interconnection.

* * * * *